(12) United States Patent
Kim et al.

(10) Patent No.: US 11,653,538 B2
(45) Date of Patent: May 16, 2023

(54) PIXEL ARRAY SUBSTRATE AND DISPLAY DEVICE INCLUDING AC EVEDD DRIVER AND DISPLAY DEVICE INCLUDING THE SAME

(71) Applicant: LG Display Co., Ltd., Seoul (KR)

(72) Inventors: Kyung Min Kim, Paju-si (KR); In Hyo Han, Paju-si (KR); Eun Ji Park, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 157 days.

(21) Appl. No.: 17/135,919

(22) Filed: Dec. 28, 2020

(65) Prior Publication Data

US 2021/0202673 A1 Jul. 1, 2021

(30) Foreign Application Priority Data

Dec. 30, 2019 (KR) ........................ 10-2019-0178612

(51) Int. Cl.
*H01L 29/08* (2006.01)
*H01L 27/32* (2006.01)

(52) U.S. Cl.
CPC ...... *H01L 27/3276* (2013.01); *H01L 27/3265* (2013.01)

(58) Field of Classification Search
CPC .................... H01L 27/3276; H01L 27/3265

USPC ......................................................... 257/40
See application file for complete search history.

(56) References Cited

U.S. PATENT DOCUMENTS

| | | | | |
|---|---|---|---|---|
| 2011/0164016 | A1* | 7/2011 | Kang | G09G 3/3233 345/82 |
| 2018/0004345 | A1* | 1/2018 | Shin | G06F 3/0412 |
| 2019/0296099 | A1* | 9/2019 | Lee | H01L 27/3258 |
| 2019/0355802 | A1* | 11/2019 | Shim | G09G 3/3225 |

FOREIGN PATENT DOCUMENTS

| | | | | |
|---|---|---|---|---|
| KR | 20160083370 A | * | 7/2016 | G09G 3/36 |
| KR | 10-2018-0003703 A | | 1/2018 | |

* cited by examiner

*Primary Examiner* — Phuc T Dang
(74) *Attorney, Agent, or Firm* — Polsinelli PC

(57) ABSTRACT

A display device including a pixel comprises an EVDD driving unit outputting an AC driving voltage swinging between a high potential voltage and a low potential voltage according to voltages of a first control node and a second control node, and a plurality of sub-pixels connected to a data line and a gate line to receive the AC driving voltage by sharing an output node of the EVDD driving unit. Each of the sub-pixels may include a light emitting element, a driving element for supplying a current to the light emitting element according to a gate-source voltage, a switch element turned-on according to a scan signal to connect the data line to the gate of the driving element, and a capacitor connected between a gate and a source of the driving element.

18 Claims, 17 Drawing Sheets

| Classification | Data_R | Data_G | Data_B |
|---|---|---|---|
| R Sensing | O | X | X |
| G Sensing | X | O | X |
| B Sensing | X | X | O |

PIXEL ARRAY SUBSTRATE AND DISPLAY DEVICE INCLUDING AC EVEDD DRIVER AND DISPLAY DEVICE INCLUDING THE SAME

CROSS REFERENCE TO RELATED APPLICATION

This application claims priority to and the benefit of Korean Patent Application No. 10-2019-0178612, filed Dec. 30, 2019, the disclosure of which is incorporated herein by reference in its entirety.

BACKGROUND

Field of the Disclosure

The present disclosure relates to a pixel array substrate capable of reducing afterimages by reducing degradation of a transistor used as a driving element of a pixel, and a display device including the same.

Description of the Background

An electroluminescent display device is roughly classified into an inorganic light emitting display device and an organic light emitting display device according to the material of a light emitting layer. The organic light emitting display device having an active matrix type includes an Organic Light Emitting Diode (hereinafter referred to as "OLED") that emits light by itself. Accordingly, there are advantages that the response speed is fast, and the luminous efficiency, brightness and viewing angle are large.

The pixels of the organic light emitting display device include an OLED, and a driving element that drives the OLED by supplying a current to the OLED according to the gate-source voltage. The OLED of the organic light emitting display device includes an anode and a cathode, and an organic compound layer formed between the anode and the cathode. The organic compound layer may include a hole injection layer (HIL), a hole transport layer (HTL), an emission layer (EML), an electron transport layer (ETL) and an electron injection layer (EIL). When a current flows through the light emitting element OLED, the holes passing through the hole transport layer (HTL) and the electrons passing through the electron transport layer (ETL) may be moved to the light emitting layer (EML) to generate excitons, and as a result, the visible light may be emitted from light emitting layer (EML).

The driving element may be implemented with a thin film transistor (TFT) of a metal oxide semiconductor field effect transistor (MOSFET) structure. The driving element should have uniform electrical characteristics among all pixels, but the electrical characteristics may be different between pixels due to process deviations and element characteristic deviations, and may change as the display driving time elapses. In order to compensate for deviations in electrical characteristics of the driving element, an internal compensation method and an external compensation method may be applied to the electroluminescent display device. The internal compensation method samples a gate-source voltage Vgs of the driving element that changes according to the electrical characteristics of the driving element and compensates for the data voltage by the gate-source voltage. The driving element may be implemented with a transistor. The external compensation method senses the voltage at the pixel that changes according to the electrical characteristics of the driving element and compensates for deviations in the electrical characteristics of the driving elements between pixels by modulating the data of the input image in the external circuit based on the sensed voltage.

In order to improve response characteristics of pixels, data of gray scale value in which a black color is displayed on a pixel (hereinafter referred to as "black gradation") may be written in pixels before next pixel data. To this end, a clock phase input to the gate driving unit should be added.

In order to implement an external compensation method, a sensing transistor, a sensing line, etc. should be added to a pixel circuit.

An EVDD line of a horizontal direction may be connected to the pixels. A horizontal crosstalk may occur on the screen due to a voltage drop of the EVDD line of the horizontal direction.

SUMMARY

Accordingly, the present disclosure is to solve the above-mentioned needs and/or problems.

In addition, the present disclosure provides a pixel array substrate and a display device including the same, which may simply implement a Black Data Insertion (BDI) and implement a simple sensing circuit capable of sensing without a separate sensing transistor and a sensing line.

The problems of the present disclosure are not limited to the problems mentioned above, and other problems not mentioned will be clearly understood by those skilled in the art from the following description.

A pixel circuit of the present disclosure may include an EVDD driving unit outputting an AC driving voltage swinging between a high potential voltage and a low potential voltage according to voltages of a first control node and a second control node, and a plurality of sub-pixels connected to a data line and a gate line to receive the AC driving voltage by sharing an output node of the EVDD driving unit. Each of the sub-pixels may include a light emitting element, a driving element for supplying a current to the light emitting element according to a gate-source voltage, a switch element turned-on according to a scan signal to connect the data line to the gate of the driving element, and a capacitor connected between a gate and a source of the driving element.

A display device of the present disclosure may include the pixel circuit.

BRIEF DESCRIPTION OF THE DRAWINGS

The above and other objects, features and advantages of the present disclosure will become more apparent to those of ordinary skill in the art by describing exemplary aspects thereof in detail with reference to the attached drawings, in which.

DETAILED DESCRIPTION

Figure 1A:
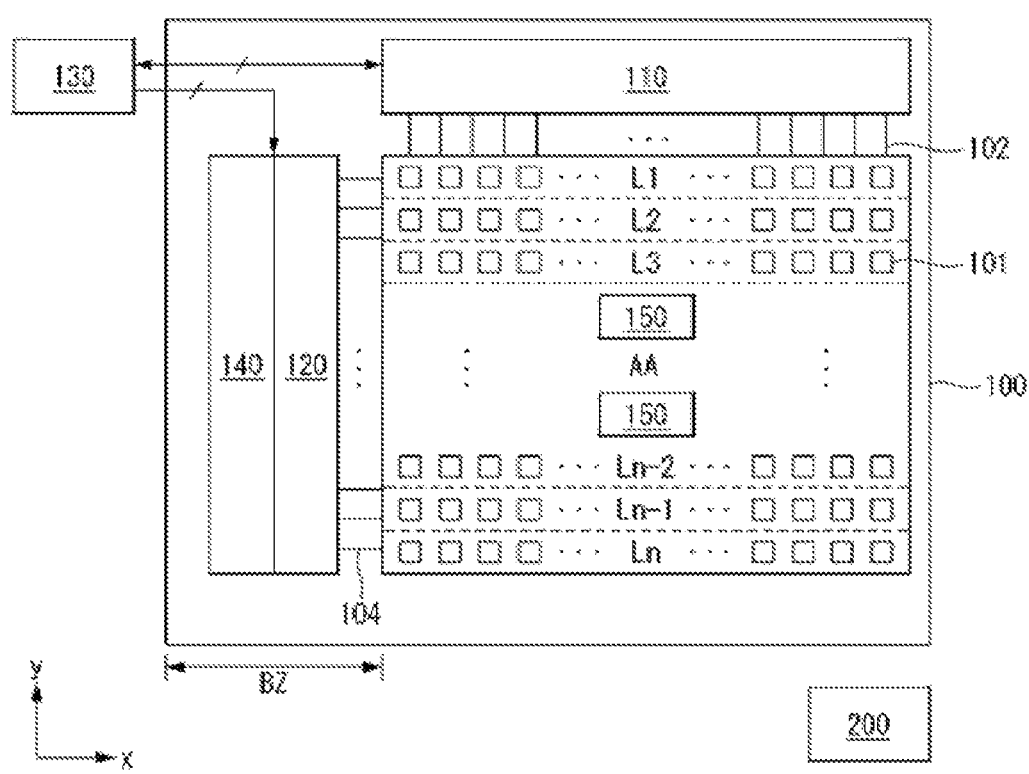
FIGS. 1A and 1B are block diagrams showing a display device according to an aspect of the present disclosure.

Advantages and features of the present disclosure, and implementation methods thereof will be clarified by the following aspects described with reference to the accompanying drawings. However, the present disclosure is not limited to aspects disclosed below, but will be implemented in various different forms. Only the aspects are provided to make the disclosure of the present disclosure complete and to fully convey the scope of the present disclosure to those skilled in the art. It is to be noted that the scope of the present disclosure is only defined by the claims.

The shapes, sizes, ratios, angles, numbers, etc. disclosed in the drawings for describing the aspects of the present disclosure are merely illustrative and are not limited to the illustrated matters in the present disclosure. The same reference numerals throughout the specification refer to the same components. In addition, in the description of the present disclosure, when it is determined that detailed descriptions of related known technologies may unnecessarily obscure the subject matter of the present disclosure, detailed descriptions thereof will be omitted.

Terms such as "including", "comprising", "having", and "composed of" used herein are intended to allow other elements to be added unless the terms are used with the term "only." Any references to singular may include plural unless expressly stated otherwise Components are interpreted to include an ordinary error range even if not expressly stated.

For description of positional relationships, for example, when the positional relationship between two parts is described as "on," "above," "below," "next to," and the like, one or more parts may be interposed therebetween unless the term "immediately" or "directly" is used in the expression.

In the description of the aspects, the first, second, etc. are used to describe various components, but these components are not limited by these terms. These terms are only used to distinguish one component from another component.

The features of various aspects of the present disclosure may be partially or entirely bonded to or combined with each other. The aspects may be interoperated and performed in various ways technically and may be carried out independently of or in association with each other.

In the display device of the present disclosure, a pixel circuit, an EVDD control unit, a gate driving unit and the like may include a driving element and a switch element. The driving element and the switch element may be implemented with one or more of n-channel transistor (NMOS) and p-channel transistor (PMOS). The transistor may be implemented as an oxide transistor having an oxide semiconductor pattern or an LTPS transistor having a low temperature poly-silicon (LTPS) semiconductor pattern. Transistors are three-electrode elements including a gate, a source, and a drain. The transistor may be implemented as a thin film transistor (TFT) on the pixel array substrate 100. The source is an electrode that supplies carriers to the transistor. In the transistor, the carriers begin to flow from the source. The drain is an electrode from which carriers are moved out of the transistor. In the transistor, the carriers move from the source to the drain. In the case of an n-channel transistor, the carriers are electrons. Thus, the source voltage is lower than the drain voltage so that the electrons move from the source to the drain. In the n-channel transistor, the direction of a current is from the drain to the source. In the case of a p-channel transistor (PMOS), the carriers are holes. Thus, the source voltage is higher than the drain voltage so that the holes may move from the source to the drain. In the p-channel transistor, the direction of a current is from the source to the drain because the holes move from the source to the drain. Therefore, it should be noted that the source and drain of the transistor are not fixed because the source and drain may be changed according to the applied voltage. In the following description, the source and drain of the transistor will be referred to as first and second electrodes.

The gate signal of the TFT used as switch elements swings between a gate-on voltage and a gate-off voltage. The gate-on voltage is set to a voltage higher than a threshold voltage at the transistor, and the gate-off voltage is set to a voltage lower than the threshold voltage at the transistor. The TFT is turned-on in response to the gate-on voltage, while it is turned off in response to the gate-off voltage. In the case of a NMOS, the gate-on voltage may be a Gate High Voltage (VGH), and the gate-off voltage may be a Gate Low Voltage (VGL). In the case of a PMOS, the gate-on voltage may be the Gate Low Voltage (VGL) and the gate-off voltage may be the Gate High Voltage (VGH).

Hereinafter, the various aspects of the present disclosure will be described in detail with reference to the accompanying drawings. In the following aspects of the present disclosure, the description of the display device will be focused on an example in which an external compensation circuit is applied.

Figure 1B:
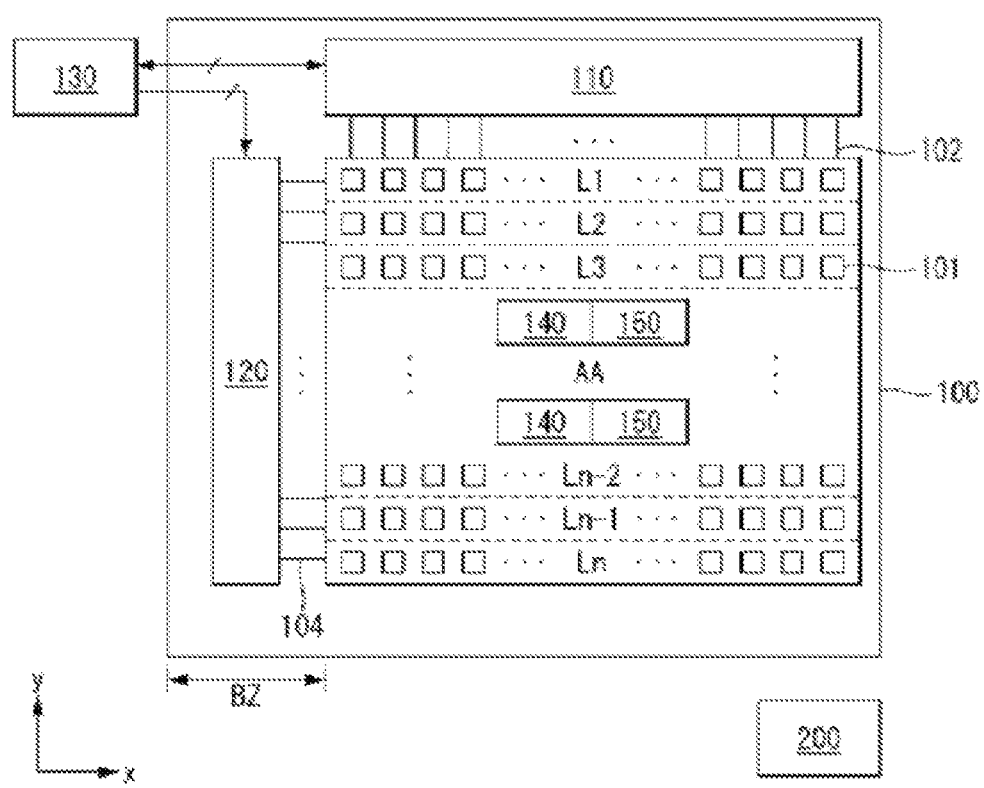
Figure 2:
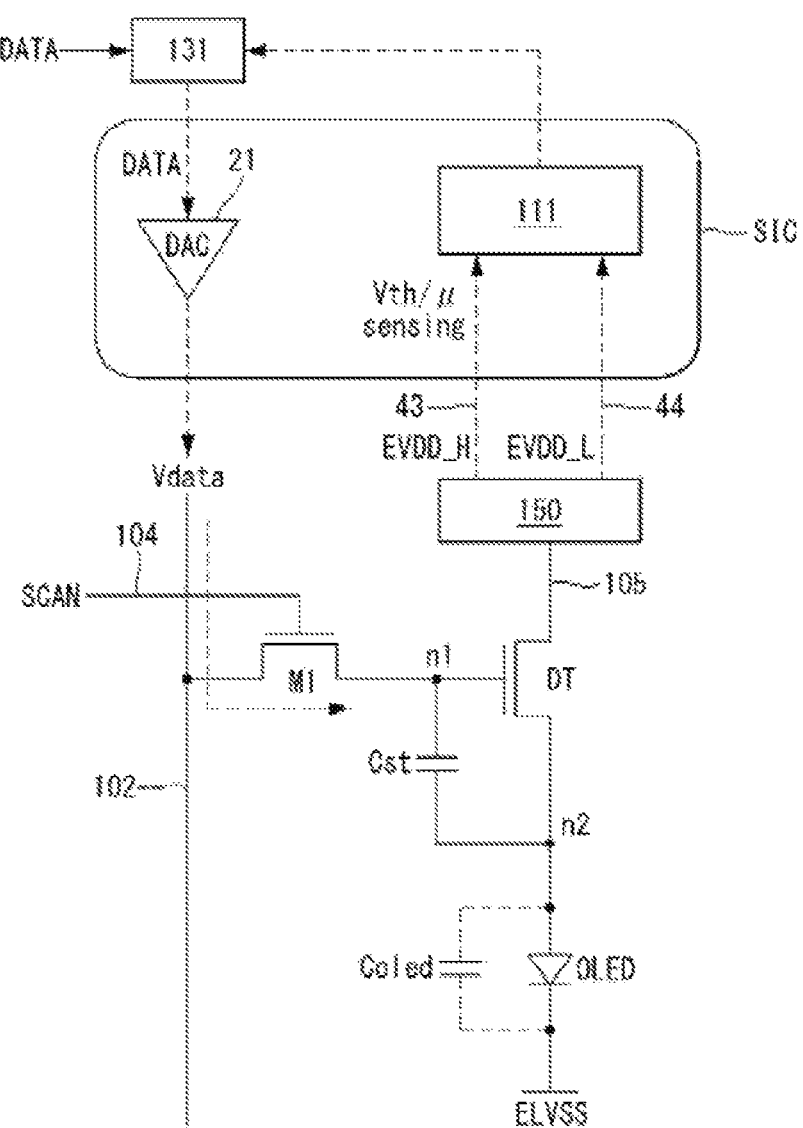
FIG. 2 is a circuit diagram showing an external compensation circuit connected to a pixel circuit.

FIGS. 1A and 1B are block diagrams showing a display device according to an aspect of the present disclosure. FIG. 2 is a circuit diagram showing an external compensation circuit connected to a pixel circuit.

FIGS. 1A to 2, the display device according to an aspect of the present disclosure includes a pixel array substrate 100, pixel driving circuits 110, 120, 140 and 150, and a power supply unit 200.

The pixels in the display device may be driven in a normal driving mode in which pixel data of an input image is written in pixels and an image is displayed on the screen, and a sensing mode in which electrical characteristics of the pixels are sensed.

In the normal driving mode, the pixel driving circuits 110, 120, 140 and 150 drive the pixels by writing pixel data to the pixels during an active period every frame period under the control of a timing controller 130. In the sensing mode, the pixel driving circuits 110, 120, 140 and 150 may sense electrical characteristics of the driving element DT for each sub-pixel at a power-on time when power of the display device starts to be applied, a vertical blank period VB, and a power-off time under the control of the timing controller 130 and compensate for changes in electrical characteristics of the driving element by selecting a compensation value according to a sensing result.

The screen of the pixel array substrate 100 includes a pixel array AA displaying an input image. The pixel array AA includes a plurality of data lines 102, a plurality of gate lines 104 intersecting the data lines 102, and pixels.

The pixels may be arranged on the screen AA in a matrix form defined by data lines DL and gate lines GL. The pixels may be arranged in various ways on the pixel array AA, such as a form sharing pixels emitting the same color, a stripe form, a diamond form, etc., in addition to the matrix form.

The pixel array includes a pixel column and pixel lines L1 to Ln intersecting the pixel column. The pixel column includes pixels arranged along the column direction (y-axis). The pixel line includes pixels arranged along a line direction (x-axis) orthogonal to the column direction (y-axis). One vertical period is one frame period required to write one frame of pixel data in all pixels on the screen. One horizontal period 1H is a scan time required to write pixel data to be written in pixels of one pixel line sharing a gate line. One horizontal period is a time obtained by dividing one frame period by the number of m pixel lines L1 to Lm.

Each of the pixels may be divided into a red (Red, R) sub-pixel, a green (Green, G) sub-pixel, and a blue (Blue, B) sub-pixel for color realization. Each of the pixels may further include a white sub-pixel. Each of the sub-pixels 101 includes the same pixel circuit. Hereinafter, a pixel may be interpreted as synonymous with a sub-pixel. The power commonly supplied to the pixels includes a pixel driving voltage (hereinafter, referred to as "EVDD") and a low potential power voltage (hereinafter referred to as "EVSS").

The plurality of sub-pixels shares an output node of an EVDD driving unit 150 to be driven by an alternating current (AC) EVDD supplied from the EVDD driving unit 150.

In the case of an organic light emitting display device, the pixel circuit may include a light emitting element, a driving element, one or more switch elements, and a capacitor. The light emitting element may be implemented with an OLED. The current of the OLED may be adjusted according to a gate-source voltage Vgs of the driving element. The driving element and the switch element may be implemented with transistors. The pixel circuit is connected to the data line 102 and the gate line 104. Each of the sub-pixels 101 may include the same pixel circuit.

Touch sensors, which are not shown, may be disposed on the pixel array substrate 100. A touch input may be sensed using separate touch sensors or may be sensed through pixels. The touch sensors may be implemented with In-cell type or In-cell type touch sensors disposed on a screen of a pixel array substrate or embedded in a pixel array in an On-cell type or an ADD-on type.

The pixel driving circuits 110, 120, 140 and 150 include a data driving unit 110, a gate driving unit 120, an EVDD control unit 140, and an EVDD driving unit 150.

A demultiplexer may be disposed between the data driving unit 110 and the data lines 102. The demultiplexer is omitted in FIG. 1. The demultiplexer is disposed between the data driving unit 110 and the data lines 102. The demultiplexer uses a plurality of switch elements connected between the output channels of the data driving unit 110 and the plurality of data lines to time-divisionally distribute a data voltage Vdata continuously output through one channel of the source drive IC (SIC) into the data lines 102. The number of data lines 102 may be reduced because one channel of the data driving unit 110 is time-divisionally connected to a plurality of data lines by the demultiplexer.

The pixel driving circuits 110, 120, 140 and 150 write data of an input image to pixels of the pixel array substrate 100 under the control of a timing controller (TCON) 130 in the normal driving mode to display the input image on the screen. The pixel driving circuits 110 and 120 may further include a touch sensor driving unit for driving the touch sensors. The touch sensor driving unit is omitted in FIG. 1. In a mobile device or a wearable device, the data driving unit 110, the timing controller 130, and the power supply circuit may be integrated in one integrated circuit.

The data driving unit 110 may be implemented with one or more source drive integrated circuit (SIC). The data driving unit 110 may include a Digital to Analog converter (hereinafter, referred to as "DAC") 21 for converting the pixel data received from the timing controller 130 to a data voltage as shown in FIG. 2. In addition, the data driving unit 110 may further include at least a part of an external compensation circuit. For example, the data driving unit 110 may further include a sensing unit 111.

The DAC 21 of the data driving unit 110 converts the pixel data (digital data) of the input image received from the timing controller 130 into a gamma compensation voltage every frame period to output a data voltage Vdata. The data voltage Vdata is applied to the pixels through the data line 102.

The gate driving unit 120 may be implemented with a Gate in Panel (GIP) circuit directly formed on a bezel (BZ) on the pixel array substrate 100 together with a TFT array of the pixel array AA. The gate driving unit 120 outputs a gate signal to the gate lines 104 under the control of the timing controller 130. The gate driving unit 120 may sequentially supply signals to the gate lines 104 by shifting the gate signal using a shift register. The gate signal may include a scan signal SCAN.

The data voltage Vdata may be divided into a data voltage of an input image and a sensing voltage. The data voltage of the input image is a gradation voltage of a pixel data input in the normal driving mode. The sensing voltage may be a predetermined voltage set independently of data of the input image. The sensing voltage is a voltage for setting a gate voltage at the driving element DT to a preset voltage level in sensing mode.

The scan signal SCAN may be generated as a pulse swinging between the gate-on voltage VGH and the gate-off voltage VGL. The switch element M1 of the pixel circuit is turned-on according to the gate-on voltage VGH of the scan signal SCAN.

The EVDD control unit 140 and the EVDD driving unit 150 generate an AC EVDD swinging between the high voltage EVDD_H and the low voltage EVDD_L.

As illustrated in FIG. 1A, the EVDD control unit 140 may be disposed on the bezel BZ, while the EVDD driving unit 150 may be disposed in the pixel array AA. In another aspect, the EVDD control unit 140 and the EVDD driving unit 150 may be disposed in the pixel array AA, as illustrated in FIG. 1B.

A power supply unit 200 generates a direct current (DC) voltage required for driving the pixel array substrate 100 and the pixel driving circuit using a DC-DC converter. The DC-DC converter may include a charge pump, a regulator, a buck converter, a boost converter, a buck-boost converter, and the like. The power supply unit 200 may adjust the DC input voltage from a host system to generate DC voltages such as a gamma reference voltage, a gate-on voltage VGH, a gate off voltage VGL, a half VDD HVDD, a high voltage EVDD_H and low voltage EVDD_L of the EVDD, and EVSS. The EVDD_L may be the same voltage as the EVSS, but is not limited thereto. The gamma reference voltage is supplied to the data driving unit 110. The gamma reference voltage is divided for each gradation through a voltage dividing circuit and supplied to the DAC 21 of the source drive IC (SIC). The half VDD voltage is one-half voltage lower than the VDD voltage and may be used as an output buffer driving voltage of the source drive IC (SIC).

The timing controller 130 transmits the pixel data DATA of the input image from the host system to the source drive IC (SIC). The timing controller 130 receives a timing signal synchronized with the pixel data DATA and controls the operation timing of the pixel driving circuits 110, 120 and 140 using the timing signal. The timing signal may include a vertical synchronization signal Vsync, a horizontal synchronization signal Hsync, a clock signal DCLK, and a data enable signal DE. The timing controller 130 may count the data enable signal DE to generate a vertical period timing and a horizontal period timing. In this case, the vertical synchronization signal Vsync and the horizontal synchronization signal Hsync may be omitted from the timing signal received by the timing controller 130.

In case where the timing controller 130 may be connected to an external compensation circuit, the timing controller 130 modulates a pixel data DATA of an input image input from a host system (not shown) by reflecting a sensing result of an electrical characteristic of a driving element to compensate for a change in an electrical characteristic of the driving element.

The timing controller 130 may adjust the frame rate to a frequency greater than or equal to an input frame frequency. For example, the timing controller 130 multiplies the input frame frequency by i times to control the operating timing of the pixel driving units 110 and 120 at a frame frequency×i (i is a positive integer greater than 0) Hz. The frame frequency is 60 Hz in a National Television Standards Committee (NTSC) system and 50 Hz in a Phase-Alternating Line (PAL) system.

The timing controller 130 generates control signals for controlling the operation timing of the pixel driving circuits 110, 120, 140 and 150 based on the timing signals Vsync, Hsync and DE received from the host system to control the pixel driving circuits 110, 120, 140 and 150. The voltage level of some of the control signals from the timing controller 130 may be converted to a gate-on voltage VGH and a gate-off voltage VGL through a level shifter (not shown) and supplied to the gate driving unit 120. The level shifter converts a low level voltage of the control signal to a gate-off voltage VGL, and a high level voltage of the control signal to a gate-on voltage VGH.

The host system may be any one of a Television (TV) system, a set top box, a navigation system, a personal computer (PC), a home theater system, a mobile device, and a wearable device.

The external compensation circuit includes a sensing line 105 connected to the pixel circuit, a sensing unit 111, and a compensation unit 131 receiving sensing data (digital data) from the sensing unit 111, as shown in FIG. 2.

A DAC and the sensing unit 111 may be integrated in the source drive IC (SIC). The timing controller 130 may include the compensation unit 131.

The sensing unit 111 samples the voltage at a first EVDD line 43 or a second EVDD line 44 in the sensing mode to be supplied to an analog-to-digital converter (hereinafter referred to as "ADC") through an integrator. The ADC may convert the voltage of the integrator into digital data and output sensing data for each sub-pixel.

The compensation unit 131 stores compensation values for compensating a threshold voltage Vth and a mobility μ of the driving element DT for each sub-pixel in a look-up table for compensation. The compensation unit 131 modulates pixel data by inputting sensing data output from the ADC of the sensing unit 111 into the lookup table for compensation and by adding or multiplying compensation data output from the lookup table for compensation to the pixel data of the input image to compensate for changes in the electrical characteristics of the driving element DT.

The pixel data DATA modulated by the compensation unit 131 is transmitted to the source drive IC (SIC), converted into a data voltage Vdata by the DAC 21, and then supplied to the data line 102.

The pixel circuit includes a light emitting element OLED, a driving element DT connected to the light emitting element OLED, a switch element M1, and a capacitor Cst, as shown in the example of FIG. 2. The driving element DT and the switch elements M1 may be implemented with n-channel transistor (NMOS).

The pixel circuit may be implemented with the simplest circuit including two transistors DT and M1 and one capacitor Cst. The pixel circuit may be sensed by being connected to an external compensation circuit. In addition, the pixel circuit may automatically compensate for deviations in electrical characteristics or changes over time of the driving elements DT with an internal compensation method, as described later.

The driving element DT of the pixel circuit is driven by the data voltage Vdata supplied through the data line 102 to generate a current. The current flowing through the driving element DT to the light emitting element OLED is determined according to a gate-source voltage Vgs of the driving element DT.

The light emitting element OLED emits light with a current generated according to the gate-source voltage Vgs of the driving element DT that changes according to the data voltage Vdata. The light emitting element OLED may be implemented with an OLED including an organic compound layer formed between an anode and a cathode. The organic compound layer may include a hole injection layer (HIL), a hole transport layer (HTL), a light emitting layer (EML), an electron transport layer (ETL), and an electron injection layer (EIL), but is not limited thereto. The anode of the light emitting element OLED is connected to the driving element DT through a second node n2, and the cathode of the light emitting element OLED is connected to EVSS electrode to which the EVSS is applied. In FIG. 2, "Coled" refers to a capacitance of the OLED.

The switch element M1 is turned-on according to the scan signal SCAN to connect the data line 102 to the first node n1 such that the data voltage Vdata is supplied to a gate of the driving element DT connected to the first node n1. The gate voltage Vg of the driving element DT is equal to the voltage at the first node n1. The switch element M1 includes a gate connected to the gate line 104 to which the scan signal SCAN is applied, a first electrode connected to the data line 102, and a second electrode connected to the first node n1.

The driving element DT supplies a current to the light emitting element OLED according to a gate-source voltage Vgs. The driving element DT includes a gate connected to the first node n1, a first electrode (or drain) connected to an output node of the EVDD driving unit 150, and a second electrode (or source) connected to an anode of the light emitting element OLED through the second node n2.

The capacitor Cst is connected between the first node n1 and the second node n2. The capacitor Cst is connected between the gate and the source of the driving element DT to charge the gate-source voltage Vgs of the driving element DT.

The EVDD driving unit 150 may be commonly connected to N-th sub-pixels (N is a positive integer of two or more) such that an AC EVDD may be supplied to the first electrode of the driving element DT of the N-th sub-pixels.

The sensing mode is distinguished between before and after the product is shipped. Before the product is shipped, the electrical characteristics (Vth, μ) of the driving element (DT) are sensed in each of the sub-pixels through an external compensation circuit connected to the pixels, and deviations of the electrical characteristics (Vth, μ) of the driving element DT are compensated for each sub-pixel according to the sensing result.

After the product is shipped, the sensing mode may be divided into an ON RF mode performed in a Power ON sequence, an RT MODE performed in a vertical blank period VB during a display driving period, and an OFF RS mode performed in a power off sequence.

In the ON RF mode, the mobility μ of the driving element may be sensed in each of the pixels when the field emission display device is powered on. A μ sensing result is compared with a mobility compensation value of the driving element measured for each sub-pixel before the product is shipped, such that a μ compensation value may be updated based on the difference. In the sensing mode before the product is shipped, the threshold voltage and mobility of the driving element for each sub-pixel are sensed, such that the threshold voltage compensation value and mobility compensation value of the driving element may be set in a look-up table. The mobility μ of the driving element may be compensated by the μ compensation value reflecting a result of sensing mobility of the driving element for each sub-pixel.

In the RT mode, the mobility μ of the pixels may be sensed in real time in a vertical blank period VB every frame period during a display driving period in which an image is displayed. The μ compensation value may be updated for each sub-pixel according to the μ sensing result. The vertical blank period VB may be allocated at a predetermined time between an active period of a (N−1)-th frame period and an active period of a N frame period.

In the OFF RS mode, the threshold voltage Vth of the driving element may be sensed in each of the pixels when the display device is turned the power off. The Vth compensation value may be updated for each sub-pixel according to the Vth sensing result. In the OFF RS mode, the timing controller 130, the pixel driving circuits 110, 120, 140, 150, and the external compensation circuit are driven for a predetermined delay time before the power is completely turned off, so that the threshold voltage Vth of the driving element may be sensed in each of the pixels in each of the sub-pixels to update the Vth compensation value for each sub-pixel.

Figure 3:
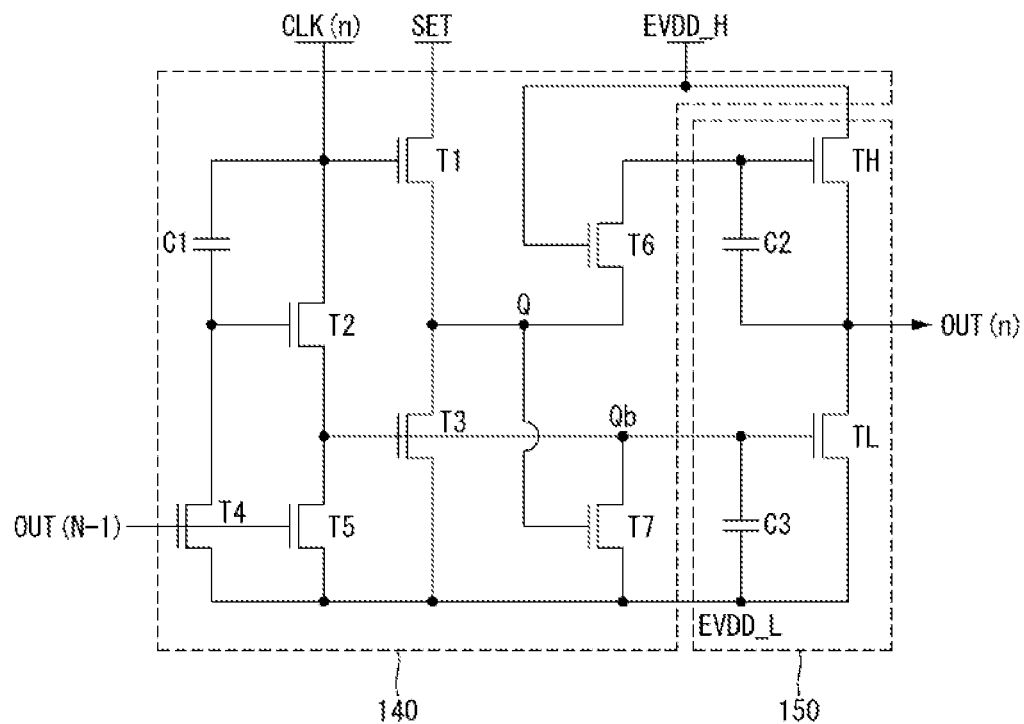
FIG. 3 is a circuit diagram showing an AC EVDD driving unit in detail and a waveform diagram showing a driving method according to an aspect of the present disclosure.
Figure 3:
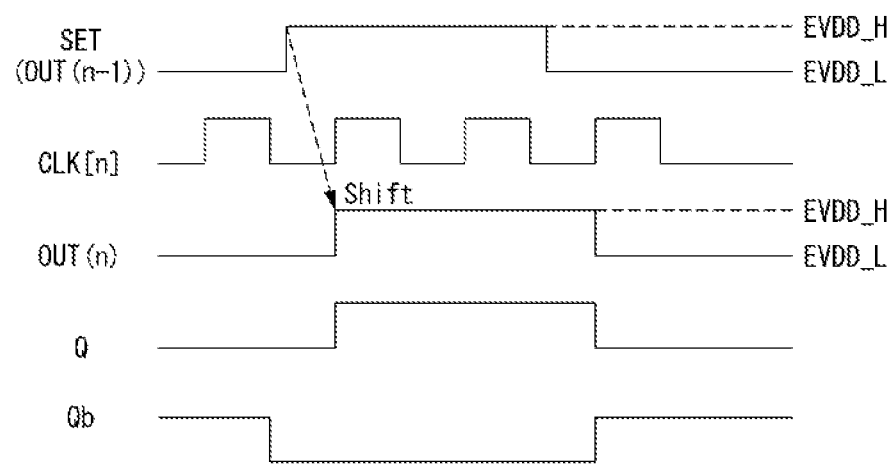

FIG. 3 is a circuit diagram showing an AC EVDD driving unit in detail and a waveform diagram showing a driving method according to an aspect of the present disclosure.

Referring to FIG. 3, the AC EVDD driving unit of the present disclosure includes EVDD transmission units SR(n−1) to SR(n+1), which are dependently connected to each other. Each of the EVDD transmission units SR(n−1) to SR(n+1) may be implemented with the same circuit as the n-th EVDD transmission unit SR(n), where n is a natural number as shown in FIG. 3.

The n-th EVDD transmission unit SR(n) includes an EVDD control unit 140 and an EVDD driving unit 150.

The EVDD control unit 140 receives a clock CLK(n), EVDD_H, and EVDD_L. The EVDD control unit 140 controls the voltages of first and second control nodes Q and Qb using a plurality of transistors T1 to T7.

The EVDD driving unit 150 charges and discharges its output node using first and second buffer transistors TH and TL to output the n-th output signal OUT(n). The n-th output signal OUT(n) is an AC EVDD voltage swinging between the EVDD_H and the EVDD_L.

When the clock CLK(n) is a high voltage and a set signal SET is a low voltage EVDD_L, the second control node Qb is charged with a voltage of the clock CLK(n) applied through a second transistor T2 to maintain a high voltage. The set signal SET is input to a first EVDD transmission unit. The set signal SET input to each of the transmission units after a second EVDD transmission unit is an output of a previous EVDD transmission unit, that is, an (n−1)-th output signal OUT(n−1).

When the set signal SET or the (n−1)-th output signal OUT(n−1) is a high voltage, a first transistor T1 is turned-on such that the first control node Q is charged, and a seventh transistor T7 is turned-on, such that the second control node Qb is discharged.

When the clock CLK(n) is a high voltage in a state where the first control node Q is charged, the first buffer transistor TH of the EVDD driving unit 150 is turned-on and the first control node Q is boosted, such that the voltage of the n-th output signal OUT(n) is increased to EVDD_H.

When the set signal SET or the (n−1)-th output signal OUT(n−1) is a low voltage and the clock CLK(n) is a high voltage, the second transistor T2 is turned-on and the second control node Qb is charged, such that the second buffer transistor TL of the EVDD driving unit 150 is turned-on and the n-th output signal OUT(n) is discharged. In this case, the voltage of the n-th output signal OUT(n) is inverted to EVDD_L.

The first transistor T1 is turned-on when the clock CLK is a high voltage to connect the set node to the first control node Q. The set signal SET or the (n−1)-th output signal OUT(n−1) is input to the set node. The clock CLK(n) is input to the EVDD control unit 140 through a clock line. The first transistor T1 includes a gate connected to the clock line, a first electrode connected to the set node, and a second electrode connected to the first control node Q.

The second transistor T2 is turned-on when the clock CLK(n) is a high voltage to connect the clock line to the second control node Qb. A first capacitor C1 is connected between the gate and the first electrode of the second transistor T2. The clock CLK(n) rises to a high voltage by the first capacitor C1, and at the same time, the gate voltage of the second transistor T2 may be rapidly risen. The first electrode of the second transistor T2 is connected to the clock line, and the second electrode of the second transistor T2 is connected to the second control node Qb.

A third transistor T3 is turned-on when the voltage at the second control node Qb is a high voltage, thereby discharging the Q node by connecting the first control node Q to the EVDD_L node. The third transistor T3 includes a gate connected to the second control node Qb, a first electrode connected to the first control node Q, and a second electrode connected to the EVDD_L node.

A fourth transistor T4 is turned-on when the voltage of the (n−1)-th output signal OUT(n) is a high voltage to connect the gate of the second transistor T2 to the EVDD_L node. In this case, the second transistor T2 is turned-off. The fourth transistor T4 includes a gate to which the (n−1)-th output signal OUT(n) is applied, a first electrode connected to the gate of the second transistor T2, and a second electrode connected to the EVDD_L node.

A fifth transistor T5 is turned-on when the voltage of the (n−1)-th output signal OUT(n) is a high voltage to connect the second control node Qb to the EVDD_L node. In this case, the voltage at the second control node Qb is discharged up to EVDD_L. The fifth transistor T5 includes a gate to which the (n−1)-th output signal OUT(n) is applied, a first electrode connected to the second control node Qb, and a second electrode connected to the EVDD_L node.

A sixth transistor T6 is turned-on when the EVDD_H is applied to the EVDD_H node to connect the first control node Q to the gate of the first buffer transistor TH. The sixth transistor T6 includes a gate connected to the EVDD_H node, a first electrode connected to the gate of the first buffer transistor TH, and a second electrode connected to the first control node Q.

A seventh transistor T7 is turned-on when a voltage at the first control node Q is a high voltage to connect the second control node Qb to the EVDD_L node. In this case, the second control node Qb is maintained at EVDD_L. The seventh transistor T7 includes a gate connected to the first control node Q, a first electrode connected to the second control node Qb, and a second electrode connected to the EVDD_L node.

The first buffer transistor TH is a pull-up transistor that is turned-on when the first control node Q is a high voltage through the sixth transistor T6 to charge the voltage at the output node to the EVDD_H. The gate of the first buffer transistor TH is connected to the first electrode of the sixth transistor T1. The first electrode of the first buffer transistor TH is connected to the EVDD_H node, and the second electrode of the first buffer transistor TH is connected to the output node. A second capacitor C2 may be connected between the gate of the first buffer transistor TH and the second electrode. The second capacitor C2 boosts the gate voltage of the first buffer transistor TH and suppresses ripple when the output node is a low voltage.

The second buffer transistor TL is a pull-down transistor, which is turned-on when the second control node Qb is a high voltage, to discharge the voltage at the output node up to the EVDD_L. The second buffer transistor TL includes a gate connected to the second control node Qb, a first electrode connected to the output node, and a second electrode connected to the EVDD_L node. A third capacitor C3 may be connected between the gate of the second buffer transistor TL and the second electrode. The third capacitor C3 suppresses the ripple of the second control node Qb.

Figure 4:
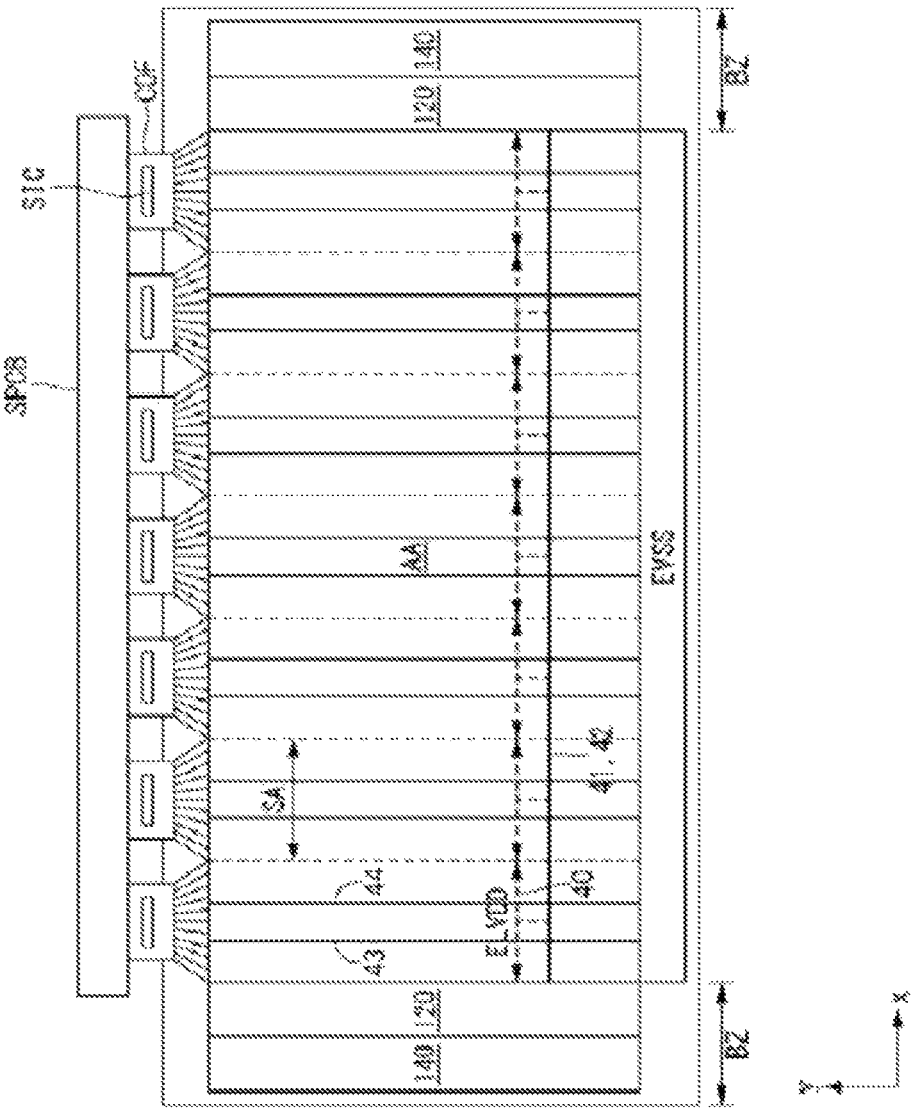
FIG. 4 is a view showing EVDD lines in a column direction and control lines in a line direction arranged in a pixel array substrate.
Figure 5:
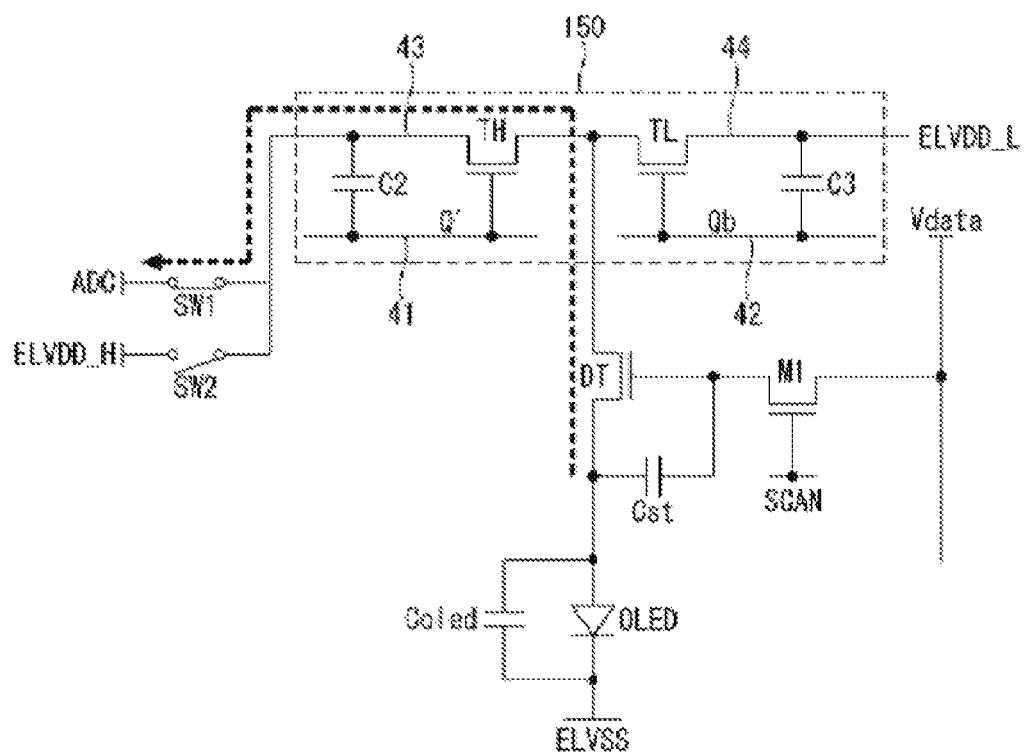
FIG. 5 is a diagram illustrating an example of a sensing path of a sub-pixel including a first EVDD line.
Figure 6:
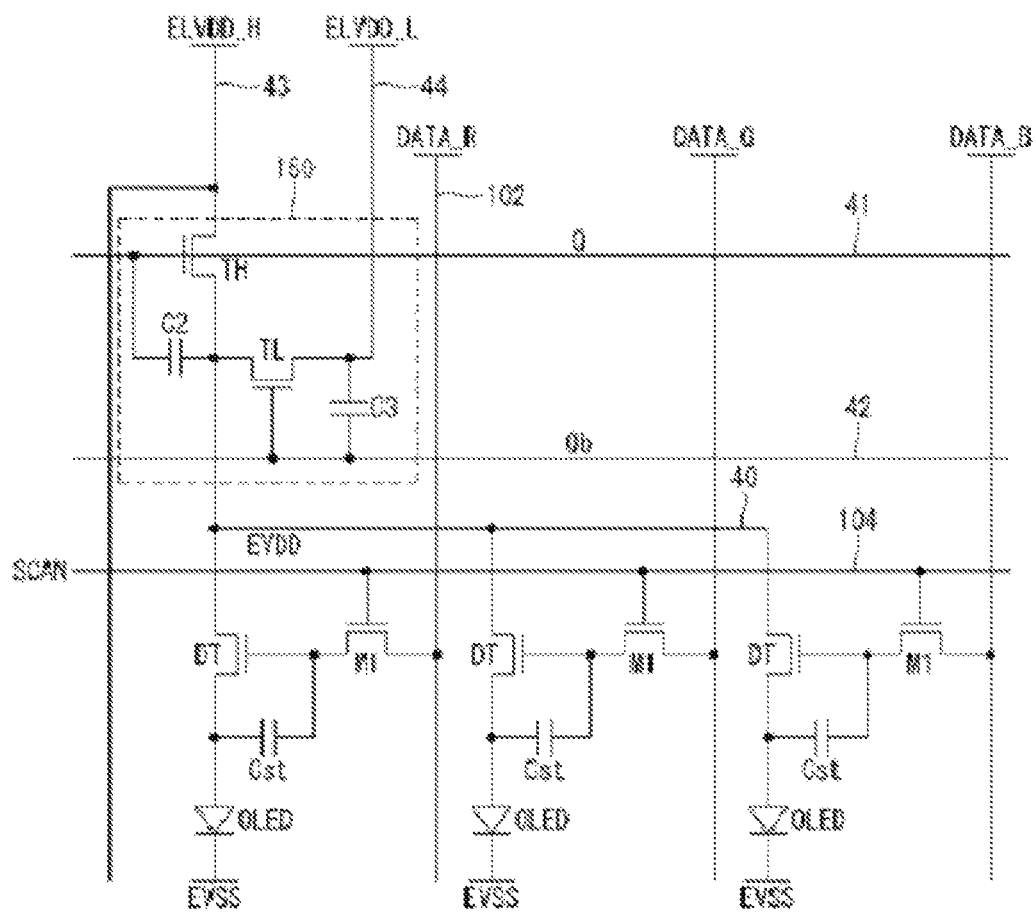
FIG. 6 is an equivalent circuit diagram showing a branch EVDD line commonly connected to RGB sub-pixels.

FIG. 4 is a view showing EVDD lines in a column direction and control lines in a line direction arranged in a pixel array. FIG. 5 is a diagram illustrating an example of a sensing path of a sub-pixel including a first EVDD line. FIG. 6 is an equivalent circuit diagram showing a branch EVDD line commonly connected to RGB sub-pixels.

Referring to FIGS. 4 to 6, the gate driving unit 120 and the EVDD control unit 140 may be disposed on edges of both side outside the pixel array AA on the pixel array substrate 100

Source drive ICs (SICs) may be mounted on a chip on film (COF) and connected between a source printed circuit board (SPCB) and a pixel array substrate 100. A touch sensor driving unit for driving touch sensors may be built in each of the source drive ICs (SICs).

The pixel array substrate 100 includes control lines 41 and 42 traversing the pixel array along the line direction x, vertical EVDD lines 43 and 44 traversing the pixel array along the column direction (y-axis), and branch EVDD lines 40 connected to the EVDD driving unit 150. A plurality of EVDD driving units 150 may be disposed on the pixel array substrate 100.

As mentioned above, the control lines 41 and 42 include a first control line 41 connected to a first control node Q of the EVDD control unit 140, and a second control line 42 connected to the second control node Qb of the EVDD control unit 140. The control lines 41 and 42 are formed of wires traversing the pixel array AA along the line direction (or horizontal direction). The control lines 41 and 42 are parallel to the gate lines 104. The control lines 41 and 42 are connected to gates of the transistors TH and TL constituting the EVDD driving unit 150 to control on/off of the transistors TH and TL.

The control lines 41 and 42 include control nodes Q and Qb to control on/off of the transistors TH and TL of the EVDD driving unit 150. If there is an appropriate margin in the voltage applied to the control lines 41 and 42, there is no voltage change of EVDD_H and EVDD_L in the entire screen even if there is a voltage drop. Consequently, the present disclosure may display an image on the pixel array AA without horizontal crosstalk caused by the voltage drop due to the existing horizontal EVDD line.

The vertical EVDD lines 43 and 44 include a first EVDD line 43 to which the EVDD_H is supplied in the normal driving mode, and a second EVDD line 44 to which the EVDD_L is supplied in the normal driving mode. The EVDD lines 43 and 44 are formed of wires traversing the pixel array AA along the column direction (or vertical direction).

In the normal driving mode, the EVDD_H is applied to the first EVDD line 43. When the sensing unit 111 is connected to the first EVDD line 43, the EVDD_L may be applied to the first EVDD line 43 in the sensing mode.

The first EVDD line 43 is connected to the first input node (EVDD_H node) of the EVDD driving units 150 to supply the EVDD_H or the EVDD_L to the first buffer transistors TH. The second EVDD line 44 is connected to the second input node (EVDD_L node) of the EVDD driving units 150 to supply the EVDD_L to the second buffer transistors TL. The first and second EVDD lines 43 and 44 are parallel to the data lines 102. The first EVDD line 43 or the second EVDD line 44 may be connected to the ADC of the sensing unit 111.

In the sensing mode, the electrical characteristics of each of the sub-pixels may be sensed by being supplied to the ADC through the first EVDD line 43 or the second EVDD line 44. When the sensing unit 111 is connected to the first EVDD line 43 as in the example of FIG. 5, the voltage applied to the first EVDD line 43 may be changed to the EVDD_L in sensing mode.

In the example of FIG. 5, the second switch SW2 is turned-on in the normal driving mode to supply the EVDD_H to the first EVDD line 43. The first switch SW1 senses OLED deterioration through the first EVDD line 43 in the sensing mode.

Each of the branch EVDD lines 40 is connected to the output node of one EVDD driving unit 150 so that an AC EVDD from the EVDD driving unit 150 is commonly supplied to N sub-pixels (N is a positive integer of two or more). Each of the branch EVDD lines 40 is formed of short wires traversing the pixel array AA along the line direction (or horizontal direction). The branch EVDD lines 40 are parallel to gate lines 104. When the length of the wires to which the AC EVDD is applied is increased, a wire resistance is increased and the EVDD_H and the EVDD_L may be changed according to the screen position due to the voltage drop. According to the present disclosure, since the AC EVDD is supplied to the sub-pixels by using short branch EVDD lines 40 separated from each other, the AC EVDD may be supplied to sub-pixels without a voltage drop in the entire screen.

The length of each of the branch EVDD lines 40 is shorter than the line direction (or horizontal direction) of the pixel array. For example, the branch EVDD lines 40 may be equal to or greater than the sum of the horizontal lengths of the N sub-pixels as shown in FIG. 6 and equal to or less than the length of the line direction (or horizontal direction) of the line area of the pixel area SA driven by one source drive IC (SIC). In other words, the length of each of the branch EVDD lines 40 may be equal to or less than the horizontal length of the pixel area SA driven by one source drive IC (SIC).

Figures 7, 8:
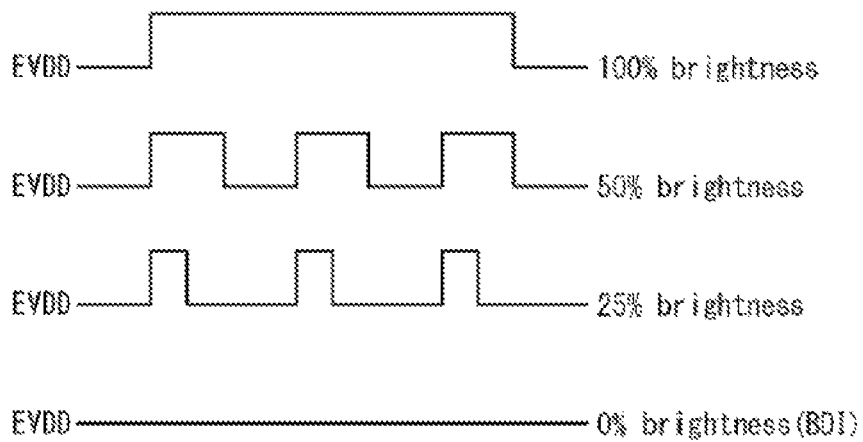
FIG. 7 is a diagram illustrating a sensing sequence of sub-pixels.
FIG. 8 is a diagram showing an example of implementing luminance adjustment and Black Data Insertion (BDI) of pixels using a Pulse Width Modulation (PWM) of an AC EVDD.

In the present disclosure, the sub-pixels R, G, and B may be sequentially sensed as shown in FIGS. 6 and 7 so that each of the sub-pixels R, G, and B may be sensed independently. For example, as shown in FIGS. 6 and 7, the sub-pixels may be sensed in the order of a red sub-pixel R, a green sub-pixel G, and a blue sub-pixel B. In FIG. 7, Data_R, Data_G, and Data_B are sensing voltages applied to the sub-pixels in the sensing mode. In the sensing mode, the sub-pixels to be sensed by a sensing voltage applied to the data line may be individually selected.

The present disclosure may easily control luminance and Black Data Insertion (BDI) of the pixels by modulating an AC current EVDD with a Pulse Width Modulation (PWM) as shown in the example of FIG. 8. For example, if a duty ratio of the AC EVDD is lowered, the luminance of the pixels may be lowered even if the data voltage of the pixel data is not lowered. In this case, the luminance of low gradation may be accurately represented. In the BDI period, even if the duty ratio of the AC EVDD is changed to 0% and the black gradation voltage is not applied to the pixels, the pixels may be turned-on and thus the BDI may be easily implemented.

The timing at which the EVDD driving unit is turned-on/off according to the voltages of the control lines 41 and 42, that is, the voltages of the control nodes Q and Qb may be controlled. The duty ratio of the AC current EVDD may be varied by the on/off timing of the EVDD driving unit 150. During the BDI period, the EVDD driving unit 150 may remain turned off.

The pixel array of the present disclosure may be implemented with a pixel arrangement capable of driving a Double Rate Driving (DRD). In the DRD, as in the example of FIG. 9, the number of data lines and the number of source drive ICs may be reduced by sharing one sub-pixel by the neighboring sub-pixels R and G. Since the DRD continuously supplies the data voltage DATA to two sub-pixels in one horizontal period 1H, the driving speed of the source drive IC may be doubled, and the number of gate lines may be increased.

Figure 9:
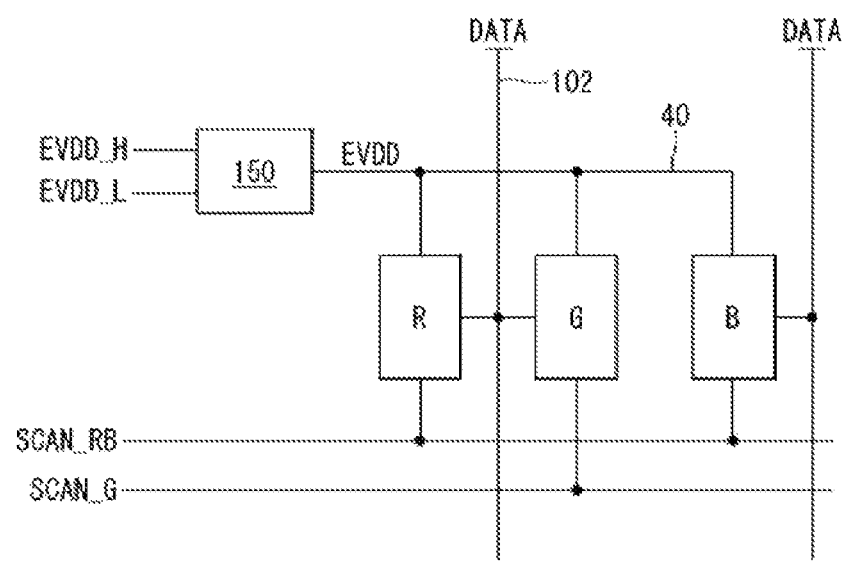
FIG. 9 is a diagram showing an example of a pixel array substrate capable of Double Rate Driving (DRD)

FIG. 9 is a diagram showing an example of a pixel array capable of driving the Double Rate Driving (DRD).

Referring to FIG. 9, among the sub-pixels arranged side by side in one pixel line, a red sub-pixel R and a green sub-pixel G are connected to one data line to which a data voltage DATA_RG is supplied. A blue sub-pixel B is connected to another data line to which a data voltage DATA_B is supplied. A white sub-pixel (not shown) may share one data line with the blue sub-pixel B.

The red sub-pixel R and the blue sub-pixel B are connected to a first gate line to which a first scan signal SCAN_RB is supplied. The green sub-pixel G is connected to a second gate line to which a second scan signal SCAN_G is supplied.

The sub-pixels of the present disclosure may be driven by an internal compensation method. When the sub-pixels are driven by the internal compensation method, the electrical characteristics (Vth, μ) of the driving element DT in each of the sub-pixels may be compensated. In case where the sub-pixels are driven by the internal compensation method, the external compensation circuit may be omitted.

Figure 10:
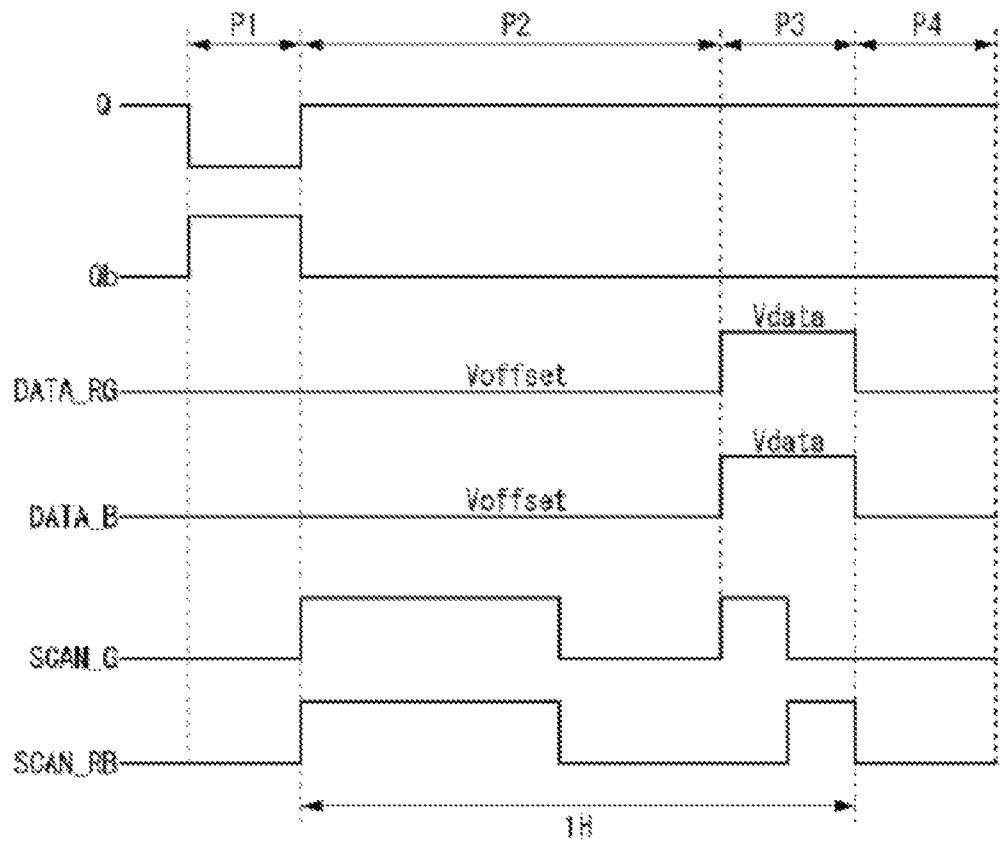
FIG. 10 is a waveform diagram showing an example of an internal compensation method of sub-pixels illustrated in FIG. 9.

FIG. 10 is a waveform diagram showing an example of the internal compensation method of the sub-pixels illustrated in FIG. 9. FIGS. 11A to 11D are diagrams showing current flow through a pixel circuit and voltages of main nodes in the first to fourth steps P1 to P4 shown in FIG. 10.

Referring to FIGS. 9 and 10, each of the sub-pixels is compensated for the threshold voltage Vth and mobility μ of the driving element DT during one horizontal period 1H, and is supplied with a data voltage of pixel data. Subsequently, the sub-pixels emit light with a current holed flowing in a light-emitting element OLED according to a gate-source voltage Vgs of the driving element DT.

The internal compensation method may be divided into first to fourth steps P1 to P4. Second and third steps P2 and P3 are executed for one horizontal period 1H.

Figure 11A:
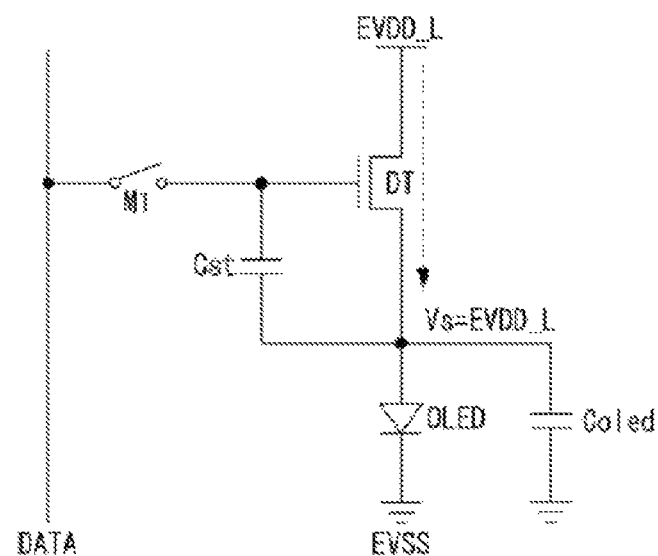
FIGS. 11A to 11D are diagrams showing current flow through a pixel circuit and voltages of main nodes in the first to fourth steps (P1 to P4) shown in FIG. 10.

A first step P1 includes a period in which the sub-pixels are initialized. In the first step P1, the voltage at the first control node Q is a low voltage and the voltage at the second control node Qb is a high voltage. Accordingly, the EVDD driving unit 150 supplies the EVDD_L to the sub-pixels through the branch EVDD line 40 as shown in FIG. 11A. In this case, a source voltage Vs of the driving element DT is initialized to the EVDD_L. A light emitting element OLED is turned-off and reset in the first step P1.

Figure 11B:
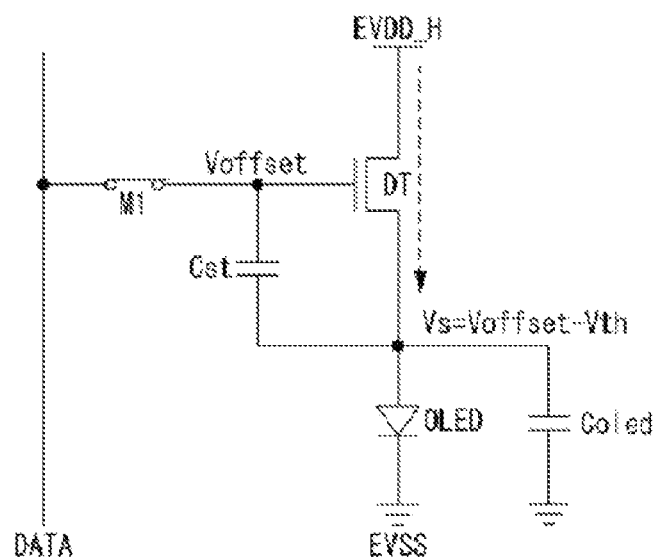

A second step P2 includes a period in which the threshold voltage Vth of the driving element DT is compensated. In the second step P2, the voltage at the first control node Q maintains a high voltage, and the voltage at the second control node Qb maintains a low voltage. Accordingly, the EVDD driving unit 150 supplies the EVDD_H to the sub-pixels through the branch EVDD line 40 as shown in FIG. 11B.

In the second step P2, an offset voltage Voffset is supplied to the data lines, and scan signals SCAN_G and SCAN_RB are simultaneously supplied to the gate lines. In this case, the gate voltage Vg of the driving element DT changes to Voffset. In the second step P2, the driving element DT operates in a saturation mode. The source voltage Vs of the driving element DT rises up to Vs=Voffset−Vth.

Figure 11C:
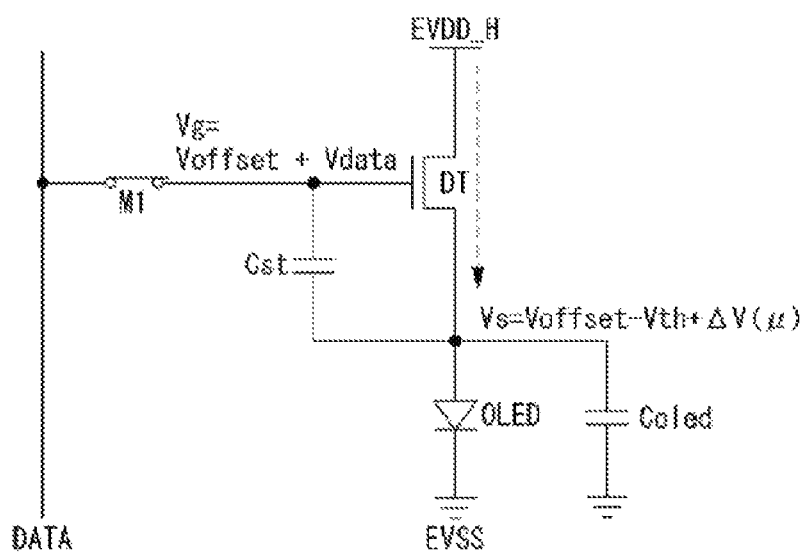

A third step P3 includes a period in which pixel data is written in the pixels and the mobility μ of the driving element DT is compensated. In the third step P3, the voltage at the first control node Q maintains a high voltage, and the voltage at the second control node Qb maintains a low voltage. Accordingly, the EVDD driving unit 150 supplies the EVDD_H to the sub-pixels through the branch EVDD line 40 as shown in FIG. 11C.

In the third step P3, the data voltage Vdata of the pixel data is supplied to the data lines, and the scan signals SCAN_G and SCAN_RB synchronized with the data voltage Vdata are sequentially supplied to the gate lines. In this case, the gate voltage Vg of the driving element DT changes to Vg=Voffset+Vdata. In the third step P2, the source voltage Vs of the driving element DT rises by a voltage ΔV(μ) reflecting the difference in mobility μ of the driving element. Therefore, the source voltage Vs of the driving element DT rises up to Vs=Voffset−Vth.

Figure 11D:
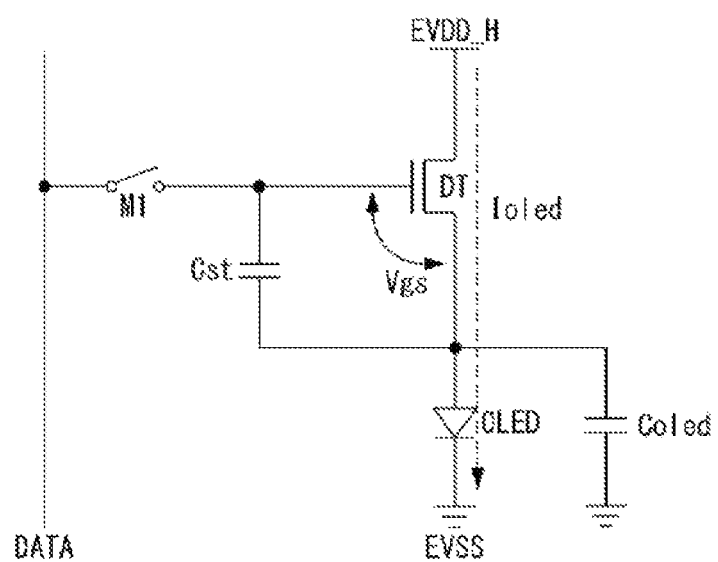

A fourth step P4 includes a period in which the light emitting element OLED emits light with a current holed flowing according to the gate-source voltage Vgs of the driving element DT. In the fourth step P4, the switch element M1 is turned-off, separating the data line and the gate of the driving element DT. In the fourth step P4, the voltage at the first control node Q maintains a high voltage, and the voltage at the second control node Qb maintains a low voltage. Accordingly, the EVDD driving unit 150 supplies the EVDD_H to the sub-pixels through the branch EVDD line 40 as shown in FIG. 11D.

As described above, in the internal compensation method of the present disclosure, the driving element DT is turned-on by applying an offset voltage Voffset to the gate of the driving element DT in the second step P2. When a voltage is charged to the source of the driving element DT by Voffset−Vth in the second step P2, the driving element DT is turned-off. Since the voltage at the source node, that is, the second node n2 of the driving element DT is changed according to the threshold voltage Vth of the driving element DT, the source voltage Vs is determined according to the threshold voltage Vth of the driving element DT. In the third step P3, when the pixel data is written in the sub-pixels, the gate-source voltage Vgs of the driving element DT changes to (Voffset+Vdata)−(Voffset−Vth), such that Vgs=Vdata+Vth. Therefore, since a current determining the brightness of the light emitting element OLED is Ioled=K(Vgs−Vth)2 in the fourth step P4 (K is a constant value), it is not affected by the difference in the threshold voltage Vth of the driving element DT.

In the third step P3, the source voltage Vs of the driving element DT changes according to a difference in mobility μ of the driving element DT. If the variation in this case refers to ΔV(μ), the gate-source voltage Vgs of the driving element DT becomes Vgs=(Voffset+Vdata)−(Voffset−Vth+ΔV(μ)).

In the third step P3, when the driving element DT is turned-on, the source voltage Vs is increased. In this case, the source voltage Vs is changed according to the mobility μ of the driving element DT. For example, when the mobility μ of the driving element DT is high, the amount of current flowing through a semiconductor channel of the driving element DT increases, such that the source voltage Vs is rapidly increased and the Vgs is decreased. As a result, the drain current Id of the driving element DT is decreased. On the other hand, if the mobility of the driving element DT is low, the current flowing through the semiconductor channel of the driving element DT is decreased, so that the source voltage Vs is less increased and Vgs is increased. As a result, Id is increased. Therefore, the current Ioled flowing through the light emitting element OLED is not affected by the difference in the mobility of the driving element DT. Accordingly, the internal compensation method of the present disclosure may drive the light emitting element OLED with a current that is not affected by the difference between the threshold voltage Vth and the mobility μ of the driving element DT.

Figure 12:
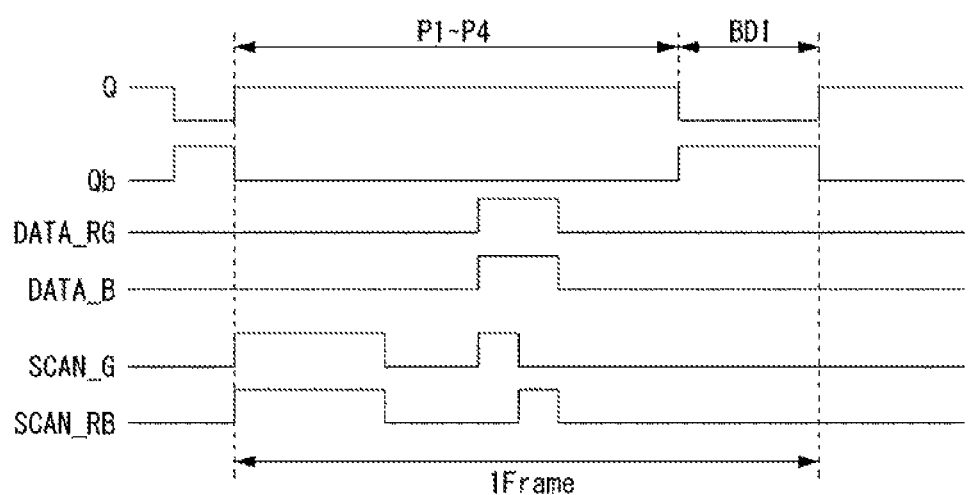
FIG. 12 is a view showing a BDI control method using an AC EVDD.
Figure 12:
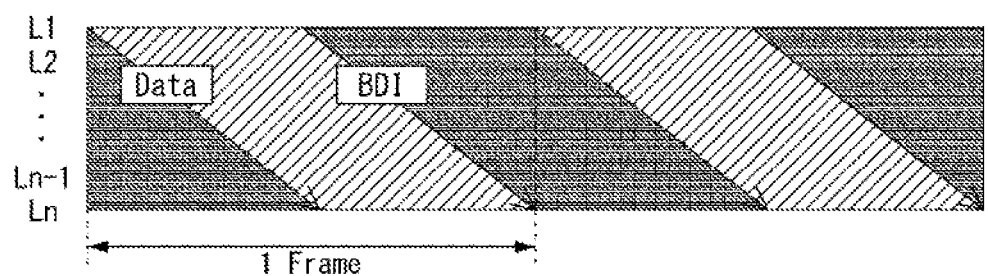

FIG. 12 is a view showing a BDI control method using an AC EVDD.

Referring to FIG. 12, according to the present disclosure, the sub-pixels may be simply driven in the BDI mode by controlling the voltage of the AC EVDD. The EVDD control unit 140 maintains the voltage at the first control node Q at a low voltage and maintains the voltage at the second control node Qb at a high voltage during a BDI period under the control of the timing controller 130. In the EVDD driving unit 150, during the BDI period, the first buffer transistor TH is turned-off while the second transistor TL is turned-on. Accordingly, since the EVDD_L is applied to the sub-pixels during the BDI period, the anode voltage of the light-emitting elements OLED is lowered, and as a result, the light-emitting elements OLED are not emitted.

The bottom view of FIG. 12 is a view showing a BDI scan direction with pixel data. In the example of FIG. 12, the pixel data Data is sequentially written in sub-pixels in units of lines from the first pixel line L1 to the n-th pixel line Ln. Subsequently, during a set BDI period before a next pixel data is written, the EVDD_L is sequentially supplied to the sub-pixels in units of lines from the first pixel line L1 to the n pixel line Ln.

Figure 13:
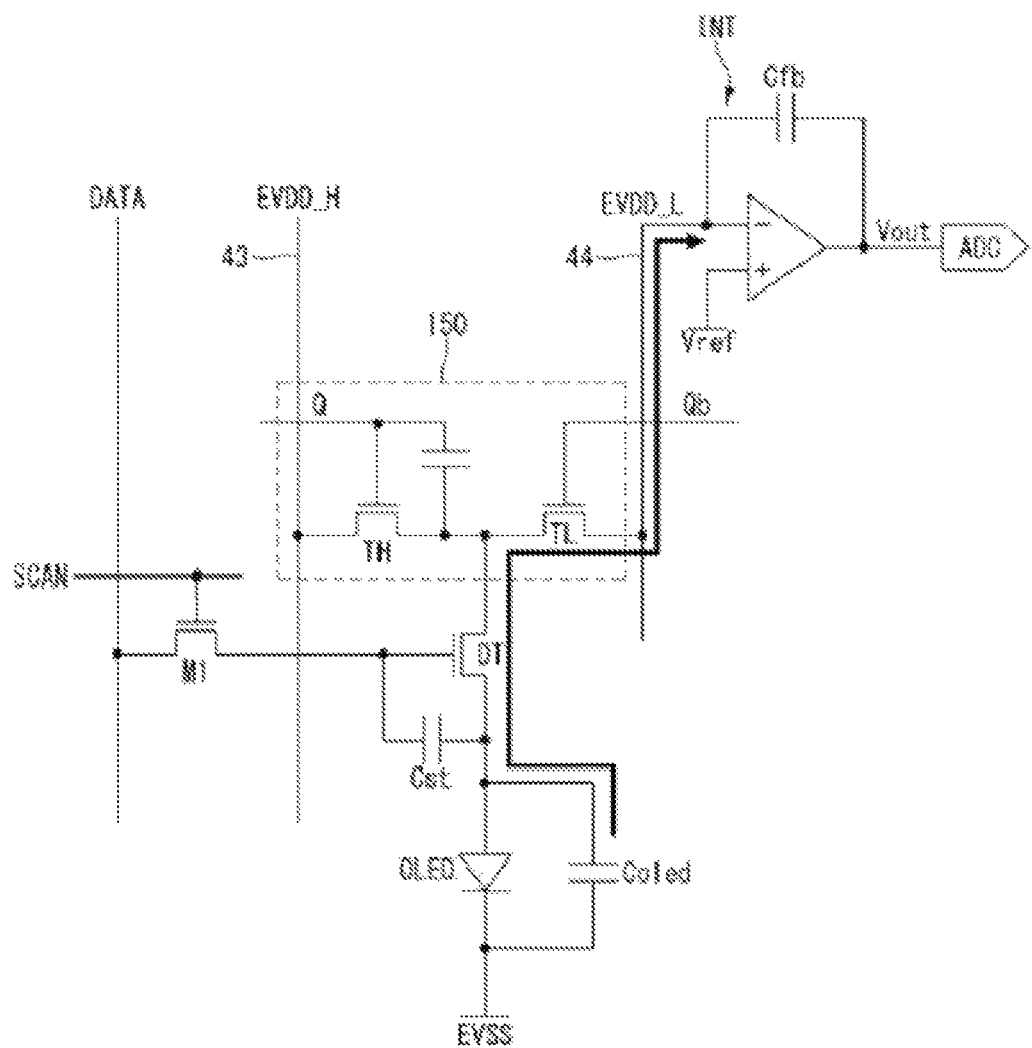
FIG. 13 is a circuit diagram illustrating a sub-pixel sensing method through an EVDD line.

FIG. 13 is a circuit diagram illustrating a sensing method of a sub-pixel through an EVDD line.

Referring to FIG. 13, in sensing mode, a sensing voltage is supplied to the data line. The sensing voltage may be set to a voltage at which the driving element DT operates in a linear region.

In the sensing mode, a sub-pixel to be sensed may be sensed through the first EVDD line 43 or the second EVDD line 44. An integrator INT and an ADC of the sensing unit may be connected to the first EVDD line 43 or the second EVDD line 44. The integrator may include an operational amplifier (OP Amp) and a feedback capacitor Cfb.

Figure 14:
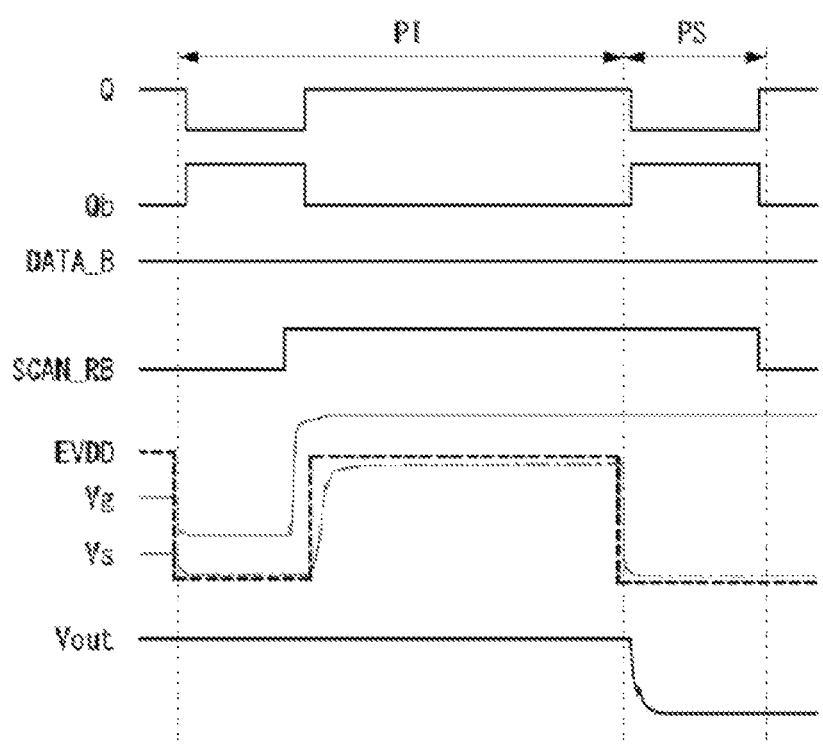
FIGS. 14 and 15 are waveform diagrams showing a sensing method.
Figure 15:
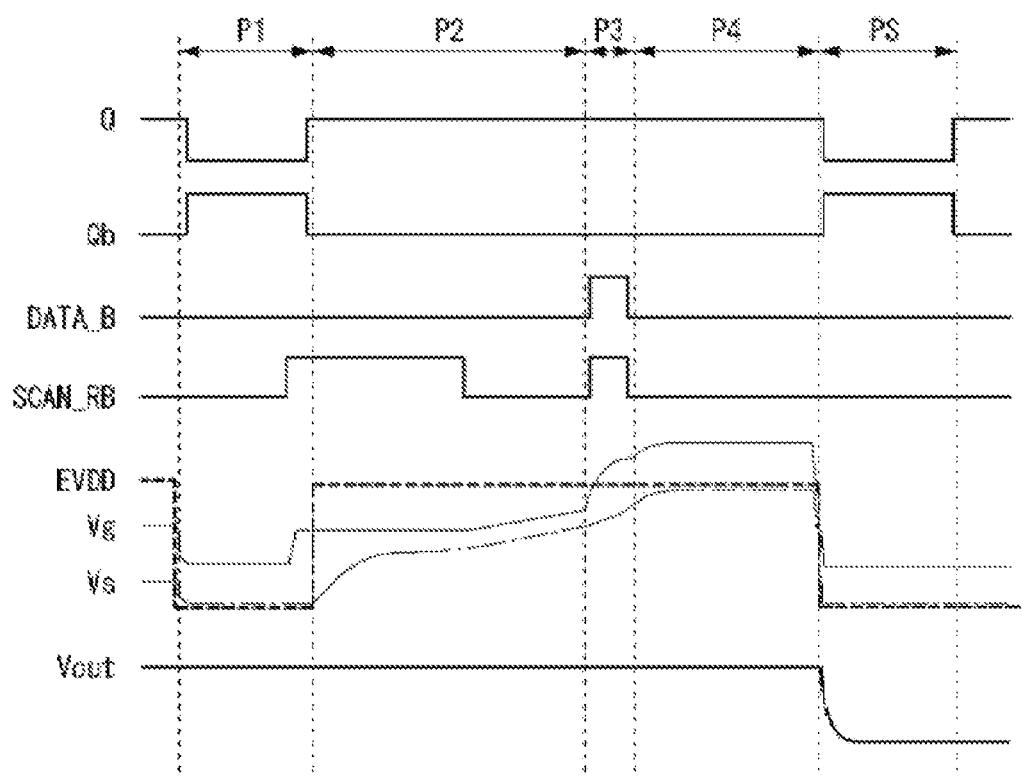

When the sub-pixel is sensed through the second EVDD line 44, the EVDD control unit 150 controls the voltage at the first control node Q to be a low voltage and controls a voltage at the second control node Qb to be a high voltage in the sensing period PS as illustrated in FIGS. 14 and 15. Accordingly, in the sensing mode, the second buffer transistor TL of the EVDD driving unit 150 is turned-on, so that the current flows through the capacitance Coled of the light emitting element OLED, the driving element DT, and the second buffer transistor TL to the integrator INT. Then, the charges are accumulated in the integrator INT and the output voltage Vout of the integrator INT is converted into digital data by the ADC.

When the sub-pixel is sensed through the first EVDD line 43, the voltage applied to the first EVDD line 43 changes to EVDD_L in the sensing mode. In this case, the integrator of the sensing unit and the ADC are connected to the first EVDD line 43. In the sensing mode, the EVDD control unit 150 controls the voltage at the first control node Q to be a high voltage and controls the voltage at the second control node Qb to be a low voltage. Accordingly, in the sensing mode, the first buffer transistor TH of the EVDD driving unit 150 is turned-on, so that the current flows through the capacitance Coled of the light emitting element OLED, the driving element DT, and the first buffer transistor TH to the integrator INT. Then, the charges are accumulated in the integrator INT and the output voltage Vout of the integrator INT is converted into digital data by the ADC.

FIGS. 14 and 15 are waveform diagrams showing a sensing method. FIGS. 14 and 15 are examples in which sub-pixels are sensed through the second EVDD line 44.

In the example of FIG. 14, the sensing voltage DATA_B is applied to the data line in the initialization period PI, so that the driving element DT is operated and turned-on in a linear region and then the current flowing through the source of the driving element DT is sensed in the sensing period PS. In the example of FIG. 15, after the threshold voltage Vth and mobility μ of the driving element DT are compensated by the internal compensation method, the sub-pixel is sensed. After the driving element DT is turned-on with the voltage applied in the third period P3, the source voltage Vs of the driving element DT is sensed through the source of the driving element DT by the current flowing through the driving element DT after the source voltage Vs of the driving element DT is boosted in the fourth period P4.

According to the present disclosure, a pixel circuit is implemented with the simplest circuit including transistors DT and M1 and one capacitor Cst. A number of sub-pixels including such a pixel circuit shares an EVDD driving unit built into the pixel array. The present disclosure may remove the sensing line and the sensing transistor from the pixel array by sensing the sub-pixels through the EVDD line without separate sensing lines for sensing the sub-pixels. In the sensing mode, the sub-pixels to be sensed by a sensing voltage applied to the data line may be individually selected.

According to the present disclosure, since the sensing unit may be removed by driving the pixel circuit with an internal compensation method, the circuit cost may be reduced.

According to the present disclosure, a horizontal crosstalk may be prevented by removing a long EVDD line of the horizontal direction in a pixel array.

According to the present disclosure, a simple BDI may be implemented using an AC EVDD in the sensing mode.

The effects of the present disclosure are not limited to the above-mentioned effects, and other effects not mentioned will be clearly understood by those skilled in the art from the description of the claims.

While the aspects of the present disclosure have been described in detail above with reference to the accompanying drawings, the present disclosure is not necessarily limited to these aspects, and various changes and modifications may be made without departing from the technical spirit of the present disclosure. Accordingly, the aspects disclosed herein are to be considered descriptive and not restrictive of the technical spirit of the present disclosure, and the scope of the technical spirit of the present disclosure is not limited by these aspects. Therefore, the above-described aspects should be understood to be exemplary and not limiting in any aspect. The scope of the present disclosure should be construed by the appended claims, and all technical spirits within the scopes of their equivalents should be construed as being included in the scope of the present disclosure.

What is claimed is:
1. A pixel array substrate, comprising:
   an EVDD driver configured to output an AC driving voltage swinging between a high potential voltage and a low potential voltage according to voltages at a first control node and a second control node;
   a plurality of sub-pixels configured to be connected to a data line and a gate line to receive the AC driving voltage by sharing an output node of the EVDD driver;
   a first EVDD line configured to be extended to a vertical direction and connected to a first input node of the EVDD driver; and
   a second EVDD line configured to be extended to a vertical direction and connected to a second input node of the EVDD driver,
   wherein the first and second EVDD lines are parallel to the data line,
   wherein each of the sub-pixels includes:
   a light emitting element;
   a driving element configured to supply a current to the light emitting element according to a gate-source voltage;
   a switch element configured to be turned-on according to a scan signal and connecting the data line to a gate of the driving element; and
   a capacitor configured to be connected between the gate and a source of the driving element.

2. The pixel array substrate according to claim 1, wherein the high potential voltage or the low potential voltage is applied to the first EVDD line, and
   wherein the low potential voltage is applied to the second EVDD line.

3. The pixel array substrate according to claim 2, wherein the high potential voltage is applied to the first EVDD line in a normal driving mode in which pixel data of an input image is written in the sub-pixels.

4. The pixel array substrate according to claim 2, wherein the low potential voltage is applied to the first EVDD line in a sensing mode in which electrical characteristics of the sub-pixels are sensed.

5. The pixel array substrate according to claim 2, further comprising first and second control lines for controlling the EVDD driver,
   wherein the first and second control lines are parallel to the gate lines.

6. The pixel array substrate according to claim 5, wherein the EVDD driver includes:
   a first buffer transistor configured to be turned-on according to a voltage at the first control line to charge the output node with the voltage from the first EVDD line; and
   a second buffer transistor configured to be turned-on according to the voltage at the second control line to connect the second EVDD line to the output node such that the output node is discharged.

7. The pixel array substrate according to claim 1, further comprising a branch EVDD line configured to connect the output node of the EVDD driver to the plurality of sub-pixels.

8. The pixel array substrate according to claim 7, wherein the branch EVDD line has a length shorter than a horizontal length of the pixel array.

9. The pixel array substrate according to claim 8, wherein the branch EVDD line has a length equal to or less than the horizontal length of a pixel region driven by a source drive IC that supplies a data voltage to the data line.

10. A display device comprising:
    a pixel array including a plurality of data lines, a plurality of gate lines, a plurality of sub-pixels connected to the data lines and the gate lines, and an EVDD driver that outputs an AC driving voltage swinging between a high potential voltage and a low potential voltage according to voltages of the first control node and the second control node;
    a data driver configured to supply data voltages to the data lines;
    a gate driver configured to sequentially supply scan signals to the gate lines;
    a first EVDD line configured to be extended to a vertical direction and connected to a first input node of the EVDD driver; and
    a second EVDD line configured to be extended to a vertical direction and connected to a second input node of the EVDD driver,
    wherein the first and second EVDD lines are parallel to the data lines,
    wherein the sub-pixels receive the AC driving voltage by sharing an output node of the EVDD driver,
    wherein each of the sub-pixels includes:

a light emitting element;

a driving element configured to supply a current to a light emitting element according to a gate-source voltage;

a switch element configured to be turned-on according to a scan signal to connect the data line to a gate of the driving element; and a capacitor configured to be connected between the gate and a source of the driving element.

11. The display device according to claim 10, further comprising a sensing circuit for sensing electrical characteristics of the sub-pixels through the first EVDD line or the second EVDD line.

12. The display device according to claim 11, wherein the low potential voltage is applied to the first EVDD line in a sensing mode in which the electrical characteristics of the sub-pixels are sensed, and wherein the first EVDD line is connected to the sensing circuit.

13. The display device according to claim 11, wherein the second EVDD line is connected to the sensing circuit.

14. The display device according to claim 10, further comprising a branch EVDD line configured to connect the output node of the EVDD driver to the plurality of sub-pixels, wherein the data driver further includes a plurality of source drive ICs connected to the data lines, and wherein the branch EVDD line has a length equal to or less than the horizontal length of a pixel region driven by one source drive IC.

15. The display device according to claim 10, wherein the pixel array further includes first and second control lines for controlling the EVDD driver, wherein the EVDD driver includes:

a first buffer transistor configured to be turned-on according to a high voltage at the first control line to charge the output node with the voltage from the first EVDD line, and a second buffer transistor configured to be turned-on according to a high voltage at the second control line to connect the second EVDD line to the output node such that the output node is discharged.

16. The display device according to claim 15, wherein the voltage at the first control node maintains a high voltage and the voltage at the second control node maintains a low voltage lower than the high voltage during an internal compensation period in which a threshold voltage and a mobility of the driving element are compensated.

17. The display device according to claim 16, wherein the voltage at the first control node maintains a low voltage and the voltage at the second control node maintains a high voltage during a Black Data Insertion (BDI) period.

18. The display device according to claim 10, further comprising an EVDD controller configured to control voltages of the first and second control nodes as follow:

wherein the voltage at the first control node maintains a low voltage and the voltage at the second control node maintains a high voltage higher than the low voltage in a sensing mode in which electrical characteristics of the sub-pixels are sensed, or wherein the voltage at the first control node maintains the high voltage and the voltage at the second control node maintains the low voltage in the sensing mode.

* * * * *